United States Patent [19]

Kwon

[11] Patent Number: 5,801,538

[45] Date of Patent: Sep. 1, 1998

[54] TEST PATTERN GROUP AND A METHOD OF MEASURING AN INSULATION FILM THICKNESS UTILIZING THE SAME

[75] Inventor: Oh Jung Kwon, Seoul, Rep. of Korea

[73] Assignee: Hyundai Electronics Industries Co., Ltd., Kyungki-do, Rep. of Korea

[21] Appl. No.: 702,835

[22] Filed: Aug. 22, 1996

[30] Foreign Application Priority Data

Aug. 22, 1995 [KR] Rep. of Korea ............... 1995-25865

[51] Int. Cl.$^6$ ............... G01R 27/26; H01L 21/66
[52] U.S. Cl. ............... 324/671; 438/18; 427/10
[58] Field of Search ............... 324/671, 660, 324/663, 686; 438/18; 427/10

[56] References Cited

U.S. PATENT DOCUMENTS

| | | | |
|---|---|---|---|
| 4,990,218 | 2/1991 | Tezaki et al. | 438/18 |
| 5,477,325 | 12/1995 | Miyashita et al. | 356/381 |
| 5,545,224 | 8/1996 | Gabriel et al. | 438/18 X |
| 5,593,903 | 1/1997 | Beckenbaugh et al. | 438/18 |
| 5,627,083 | 5/1997 | Tounai | 438/18 |

FOREIGN PATENT DOCUMENTS

| | | | |
|---|---|---|---|
| 1040263 | 10/1958 | Germany | 324/671 |
| 0165002 | 9/1983 | Japan | 324/671 |
| 0207002 | 10/1985 | Japan | 324/671 |

Primary Examiner—Michael Brock
Attorney, Agent, or Firm—Scott C. Harris, Esq.

[57] ABSTRACT

The present invention relates to a test pattern group and a method for measuring an insulation film thickness utilizing the same, and to the test pattern group comprising at least 3 (three) test patterns having a construction of a capacitor and a method for more precisely measuring the insulation film thickness utilizing the test pattern group, in a method for electrically measuring a capacitance of the insulation film applied to a semiconductor device and converting the measured capacitance to a thickness of the insulating film.

7 Claims, 4 Drawing Sheets

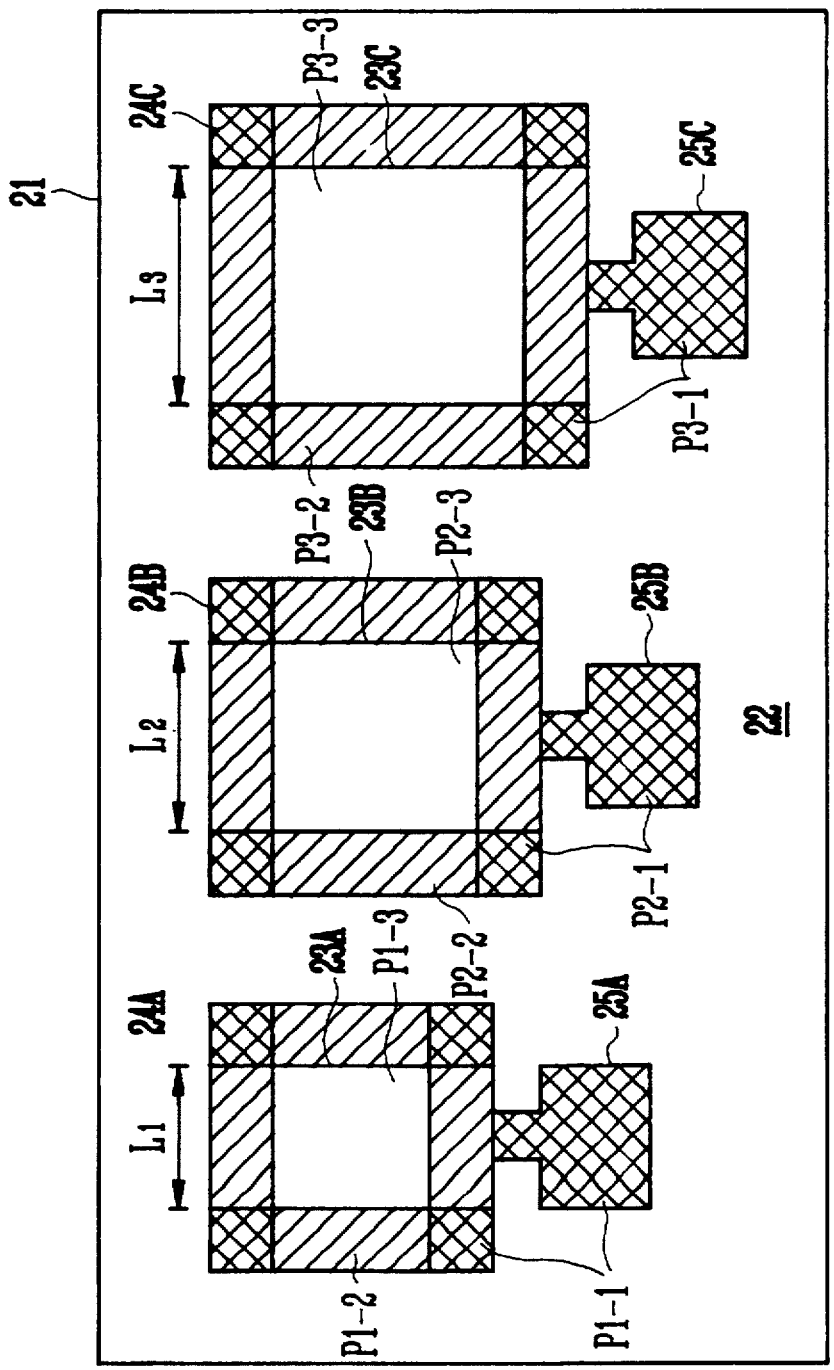

TEST PATTERN GROUP AND A METHOD OF MEASURING AN INSULATION FILM THICKNESS UTILIZING THE SAME

BACKGROUND OF THE INVENTION

1. Field of the Invention

The present invention relates to a test pattern group and a method for measuring an insulation film thickness utilizing the same, and particularly, to the test pattern group comprising at least 3 (three) test patterns having a construction of a capacitor and a method for more precisely measuring the insulation film thickness utilizing the test pattern group, in a method for electrically measuring a capacitance of the insulation film applied to a semiconductor device and converting the measured capacitance to a thickness of the insulating film.

2. Information Disclosure Statement

In general, since an insulation film such as an insulation film of a transistor and a dielectric film of a capacitor is too thin, it is difficult to physically measure the thickness thereof. To solve the problem, a method is being utilized in which after a capacitance of an insulation film is electrically measured, the measured capacitance is converted into the thickness of the insulation film. However, in measuring the capacitance of the insulation film, it is impossible to precisely measure the capacitance of the insulation film due to a bulk overlap capacitance which induces an error. Therefore, the problem is that it is impossible to precisely measure the thickness of the insulation film. The problem will be described with reference to FIGS. 1A and 1B illustrating a case of measuring the thickness of the insulation film of a transistor.

FIG. 1A is a sectional view of a conventional test pattern, and FIG. 1B is a plan view of FIG. 1A.

An active region A and field region B are defined in a silicon substrate 11 by an element separation process. A field oxide film 12 is formed in the field region B by an oxidation process. As shown in FIG. 1A, the field oxide film 12 is formed to have a curved, arc-like, narrowing region. This region is called a bird's beak. The length of the bird's beak of the field oxide film 12, $L_{bb}$, is the distance from the vertex of the arc to the point where the arc becomes a straight line. An insulation film 13 is formed in the active region A of the silicon substrate 11. A conductive layer 14 is formed on the insulation film 13, and at this time, the conductive layer 14 may expand to the edge of the field oxide film 12. When the conductive layer 14 is formed, a pad 15 integrated with the conductive layer 14 is formed. According to such process, the test pattern 10 is formed which has the construction of the capacitor in which the silicon substrate 11 becomes a lower plate, the conductive layer 14 becomes a upper plate, and the insulation film 13 becomes a dielectric film. In order to obtain the thickness of the insulation film 13, a negative voltage is applied to the pad 15 and the ground is connected to the substrate 11 to make an accumulation mode so as to measure the capacitance of the insulation film 13. Then, the thickness of the insulation film 13 is obtained by an equation (1) below.

$$C_I = \frac{\epsilon_o \cdot \epsilon \cdot S_I}{T_{ox}} \quad (1)$$

Here, "$C_I$" is the capacitance of the insulation film, "$\epsilon_o$" is the dielectric constant of a vacuum, "E" is the dielectric constant of an oxide, "$S_I$" is the area of the insulation film, and "Tox" is the thickness of the insulation film.

However, since the capacitance "$C_I$" of the insulation film 13 does not take into consideration "$C_{BB}$", "$C_F$" and "$C_P$" which are the capacitance at the area "$S_{BB}$" of a bird's beak due to a length "$L_{BB}$" of the bird's beak of the field oxide film 12, the area "$S_F$" of the field oxide film 12 covered by the conductive layer 14, and the area "$S_P$" due to the pad 15 made for easy measurement, an error corresponding thereto occurs. The capacitance "$C_I$" at the insulation film 13 which does not take into consideration such error can not be the actual capacitance of the insulation film 13. Therefore, it is impossible to obtain Tox which is the exact thickness of the insulation film 13 by the method described above.

To solve the problem above, a method is taken in which the capacitance "$C_I$" of the actual insulation film 13 is calculated by deriving the capacitance "$C_{BB}$" at bird's beak by equation (2), below, by measuring "$L_{BB}$" the length of the bird's beak, thereafter, deducting the capacitance "$C_{BB}$" at bird's beak from equation (1).

$$C_{BB} = \frac{\epsilon_o \cdot \epsilon \cdot S_{BB}}{t} \quad (2)$$

Here, "t" is the thickness of the field oxide film.

However, there are problems also that this method regards the shape of the bird's beak as a simple straight line, and the capacitance "$C_F$" at the field oxide film 12 and the capacitance "$C_P$" at the pad 15 are not taken into consideration.

As described above, in case where the test pattern is formed on the test wafer and the above described calculation method is applied, the capacitance "$C_I$" at the insulation film 13 cannot be precisely obtained because there is no consideration of the bulk overlap capacitance "$C_{BB}$", "$C_F$" and the capacitance "$C_P$" at the pad 15. Therefore, the precise thickness "Tox" of the insulation film 13 cannot be obtained. In addition, there is a disadvantage in that information about each bulk overlap capacitance "$C_{BB}$", "$C_F$", and the capacitance "$C_P$" at the pad 15 is not known.

SUMMARY OF THE INVENTION

Therefore, the object of the present invention is to provide a test pattern group which makes it possible to know the thickness of an insulation film by precisely measuring the capacitance of the insulation film, and a method of measuring the thickness of the insulation film utilizing the test pattern group.

Another object of the present invention is to provide a test pattern group which makes it possible to precisely measure the bulk overlap capacitance and the capacitance at the pad, and a method of measuring the thickness of the insulation film utilizing the test pattern group.

A test pattern group of the present invention to achieve the above described object is comprised of at least 3 (three) test patterns, each of the test patterns having an active region defined in a silicon substrate by forming a field oxide film, an insulation film formed on the active region, and a conductive layer formed on the insulation film, wherein each of the active regions of each the test pattern having a different size form each other.

In addition, A method for electrically measuring a capacitance of an insulation film applied to a semiconductor device and converting the measured capacitance to a thickness of the insulating film of the present invention to achieve the above described object is characterized in that it comprises the steps of: providing a test pattern group having at least 3 (three) test patterns, each of the test patterns having an active region defined in a silicon substrate by forming a field oxide film, an insulation film formed on the active region, a conductive layer formed on the insulation film, and a pad integrated with the conductive layer, wherein each of the active regions of each test pattern having a different size form each other; measuring the capacitance of each test pattern by making an accumulation mode for each test pattern by applying voltage to each pad and applying ground voltage to the substrate; deriving each coefficient given to each term of an equation given below by substituting the capacitance value measured on each test pattern and each length of the insulation film comprising each test pattern to the equation according to each test pattern; taking a value of second power term as the capacitance value for each insulation film by applying a second power term coefficient among the derived coefficients to the second power term; and converting the capacitance value at each insulation film to the thickness of each insulation film.

$$C = a + b \cdot L + c \cdot L^2 \quad \text{(equation)}$$

Where, "C" is the capacitance of the test pattern, "a" is the coefficient of the constant term, "b" is the coefficient of the first power term, "c" is the coefficient of the second power term, and "L" is the length of the insulation film.

BRIEF DESCRIPTION OF THE DRAWINGS

For fuller understanding of the nature and objects of the invention, reference should be had to the following detailed description taken in conjunction with the accompanying drawings in which:

FIG. 2B is a plan view of FIG. 2A; and

Similar reference characters refer to similar parts in the several views of the drawings.

DETAILED DESCRIPTION OF THE INVENTION

Figure 1A:
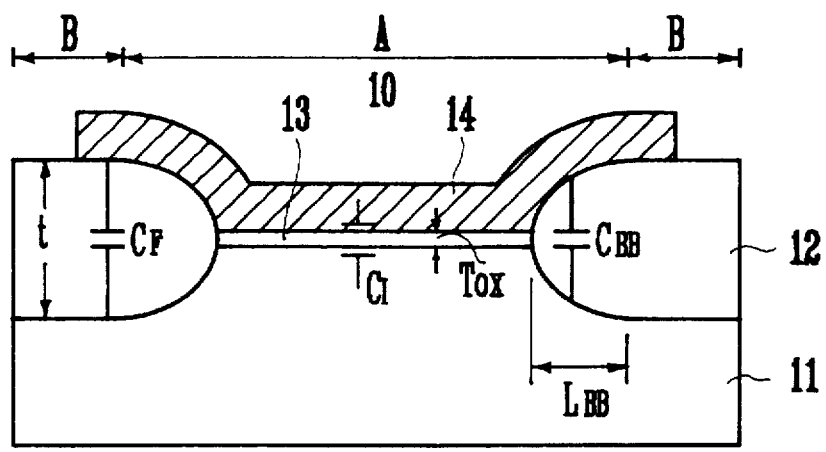
FIG. 1A is a sectional view of a conventional test pattern.
Figure 1B:
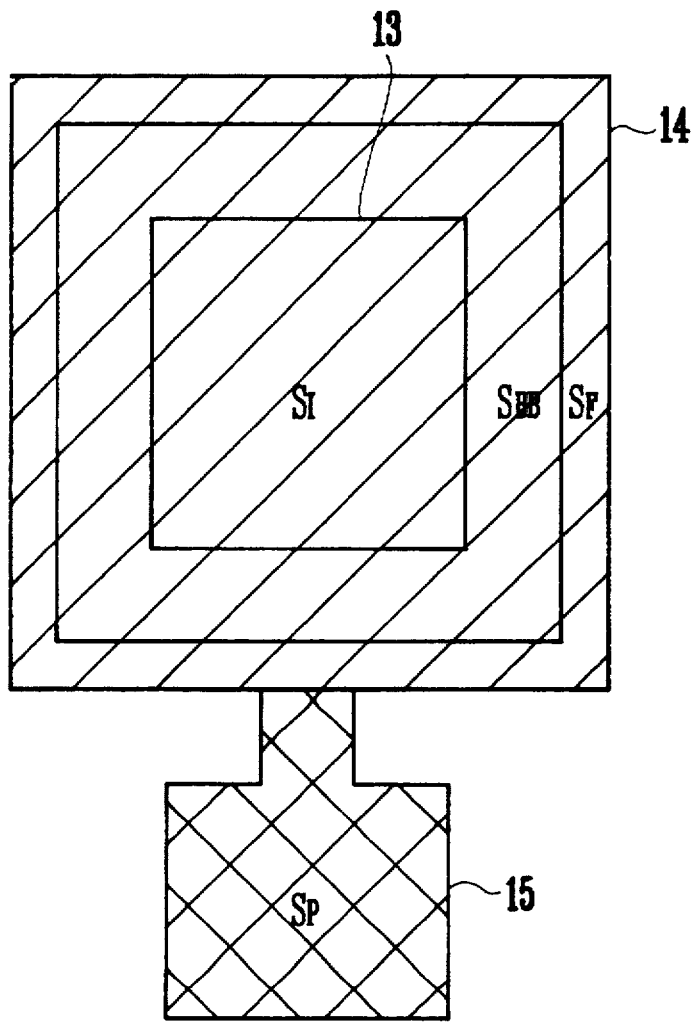
FIG. 1B is a plan view of FIG. 1A.
Figure 2A:
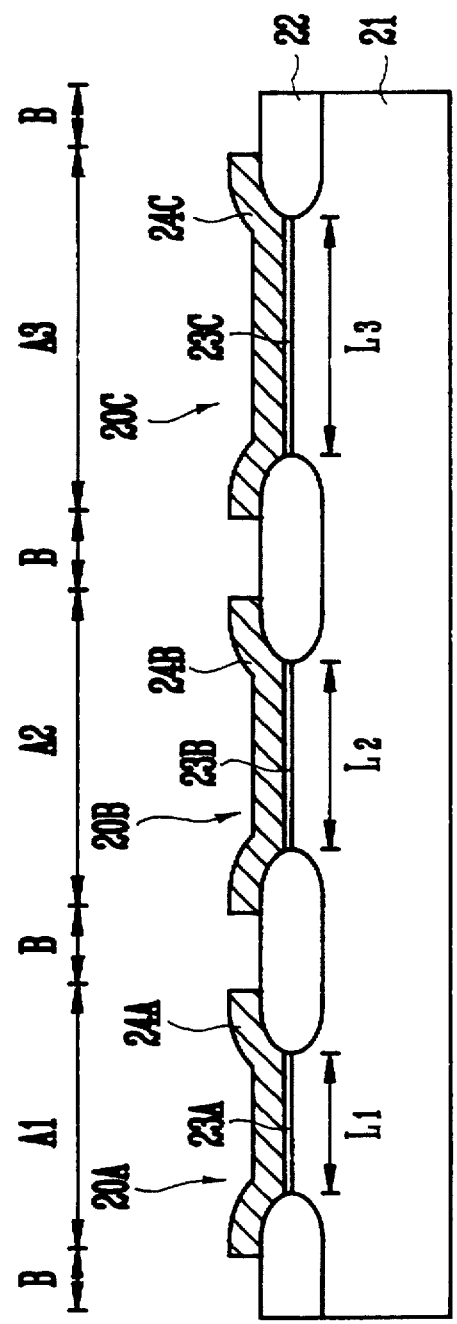
FIG. 2A is a sectional view of a test pattern group of the present invention.

FIG. 2A is a sectional view of a test pattern group of the present invention and FIG. 2B is a plan view of FIG. 2A.

An active region and a field region B are defined in a silicon substrate 21 by an isolation process. At that time, the active region shall be defined to have at least 3 (three) regions and the shape shall be rectangular and the size shall be different for each region. In the drawings illustrating the present invention, the active region having 3 (three) defined regions, that is, a first, second and third active regions A1, A2 and A3 is shown. A field oxide film 22 is formed in the field region B by an oxidation process. First, second and third insulation films 23A, 23B and 23C are formed as insulation films on the first, second and third active region A1, A2 and A3 of the silicon substrate 21, respectively. First, second and third conductive layers 24A, 24B and 24C are formed on the first, second and third insulation films 23A, 23B and 23C, respectively, and at that time, there can arise a case where each of the first, second and third conductive layers 24A, 24B and 24C expands to the edge of the field oxide film 22. At the time of forming the first, second and third conductive layers 24A, 24B and 24C, first, second and third pads 25A, 25B and 25C integrated with the first, second and third conductive layers 24A, 24B and 24C, respectively, are formed. Each of the first, second and third pads 25A, 25B and 25C is identical in their shape and size on the field oxide film 22. According to the process described above, first, second and third test patterns 20A, 20B and 20C are completed which have the constructions of capacitors in which the silicon substrate 21 becomes the lower plate, each of the first, second and third conductive layers 24A, 24B and 24C becomes the upper plate, and each of the first, second and third insulation films 23A, 23B and 23C becomes the dielectric film.

As described above, a test pattern group of the present invention comprise 3 (three) test patterns 20A, 20B and 20C. Though the embodiment of the present invention discloses to the test pattern group having 3 test patterns 20A, 20B and 20C, the test pattern group can be comprised of at least 3 test patterns.

To overcome the disadvantage occurring from the equation (1) and (2) for obtaining the thickness of an insulation film, and to obtain the precise thickness of an insulation film, the capacitance for a test pattern must be obtained by the equation (3) below. The reason for forming the rectangular test patterns of different size according to the present invention is to obtain each factor of the equation (3).

$$C = C_I + C_{BB} + C_F + C_P \quad (3)$$

Here, "$C_I$" is the capacitance at an insulation film, "C" is the total capacitance of a test pattern, "$C_{BB}$" is the capacitance at a bird's beak, "$C_F$" is the capacitance at a field oxide film and "$C_P$" is the capacitance at a pad. The capacitance "$C_I$" at the insulation film is the total capacitance "C" of the test pattern minus the bulk overlap capacitances "$C_{BB}$", "$C_F$" and "$C_P$".

The method of measuring the thickness of a insulation film utilizing 3 (three) test patterns shown in FIGS. 2A and 2B is described below.

To make the accumulation mode for each of a first, second and third test patterns 20A, 20B and 20C, a voltage (negative voltage for the case of the substrate being P-type, and positive voltage for the case of the substrate being N-type) is applied to each of the first, second and third pads 25A, 25B and 25C, and the ground voltage is applied to the substrate 21. Each of capacitances "$C_1$", "$C_2$" and "$C_3$" is measured for each of the first, second and third test patterns 20A, 20B and 20C. Each of the capacitances "$C_1$", "$C_2$" and "$C_3$" is expressed as functions of each length "$L_1$", "$L_2$" and "$L_3$" of the first, second and third insulation films 23A, 23B and 23C, each of the capacitances "$C_1$", "$C_2$" and "$C_3$" can be expressed as equations (4), (5) and (6), respectively.

$$C_1 = a + b \cdot L_1 + c \cdot L_1^2 \quad (4)$$

$$C_2 = a + b \cdot L_2 + c \cdot L_2^2 \quad (5)$$

$$C_3 = a + b \cdot L_3 + c \cdot L_3^2 \quad (6)$$

Here, "a" is a coefficient of constant term, "b" is a coefficient of first power term, and "c" is a coefficient of second power term. The coefficients "a", "b" and "c" in each term can be obtained from 3 (three) equations since the values of each length "$L_1$", "$L_2$" and "$L_3$" and each capacitance "$C_1$", "$C_2$" and "$C_3$" can be known.

The constant term "a" in the equation (4) is influenced by a capacitance at a first portion P1-1 of the first test pattern 20A. The capacitance at the first portion P1-1 is the sum of the capacitance "$C_P$" at the first pad 25A and a capacitance at corner portions of the bird's beak and field oxide film 22, therefore, the value of the coefficient "a" itself means the sum of the capacitances at two elements. The first power term "b·L$_1$" in the equation (4) is influenced by a capacitance at a second portion P1-2 excluding the capacitance at the first portion P1-1 of the bird's beak and field oxide film 22. The second power term "c·L$_1^2$" in the equation (4) is influenced by a capacitance at a third portion P1-3 of the first test pattern 20A. The capacitance at the third portion P1-3 is the capacitance at the first insulation film 23A and corresponds to "C$_I$" in the equation (3). The second power term "c·L$_1^2$" represents the precise capacitance "C$_I$" of the first insulation film 23A including no error, excluding the capacitances "C$_{BB}$" and "C$_F$" at the bulk overlap and the capacitance "C$_P$" at the first pad 25A. The constant term "a" in the equation (5) is influenced by a capacitance at a first portion P2-1 of the second test pattern 20B. The capacitance at the first portion P2-1 is the sum of the capacitance "C$_P$" at the second pad 25B and a capacitance at corner portions of the bird's beak and field oxide film 22, therefore, the value of the coefficient "a" itself means the sum of the capacitances at two elements. The first power term "b·L$_2$" in the equation (5) is influenced by a capacitance at a second portion P2-2 excluding the capacitance at the first portion P2-1 of the bird's beak and field oxide film 22. The second power term "c·L$_2^2$" in the equation (5) is influenced by a capacitance at a third portion P2-3 of the second test pattern 20B. The capacitance at the third portion P2-3 is the capacitance at the second insulation film 23B and corresponds to "C$_I$" in the equation (3). The second power term "c·L$_2^2$" represents the precise capacitance "C$_I$" at the second insulation film 23B including no error, excluding the capacitances "C$_{BB}$" and "C$_F$" at the bulk overlap and the capacitance "C$_P$" at the second pad 25B. The constant term "a" in the equation (6) is influenced by a capacitance at a first portion P3-1 of the third test pattern 20C. The capacitance at the first portion P3-1 is the sum of the capacitance "C$_P$" at the third pad 25A and a capacitance at corner portions of the bird's beak and field oxide film 22, therefore, the value of the coefficient "a" itself means the sum of the capacitances at two elements. The first power term "b·L$_3$" in the equation (6) is influenced by a capacitance at a second portion P3-2 excluding the capacitance at the first portion P3-1 of the bird's beak and field oxide film 22. The second power term "c·L$_3^2$" in the equation (6) is influenced by a capacitance at a third portion P3-3 of the third test pattern 20C. The capacitance at the third portion P3-3 is the capacitance at the third insulation film 23C and corresponds to "C$_I$" in the equation (3). The second power term "c·L$_3^2$" represents the precise capacitance "C$_I$" at the third insulation film 23C including no error, excluding the capacitances "C$_{BB}$" and "C$_F$" at the bulk overlap and the capacitance "C$_P$" at the third pad 25C.

Therefore, since the precisely measured capacitance at a insulation film is converted to the thickness by a known method, the precise thickness of the insulation film can be obtained.

Figure 3:
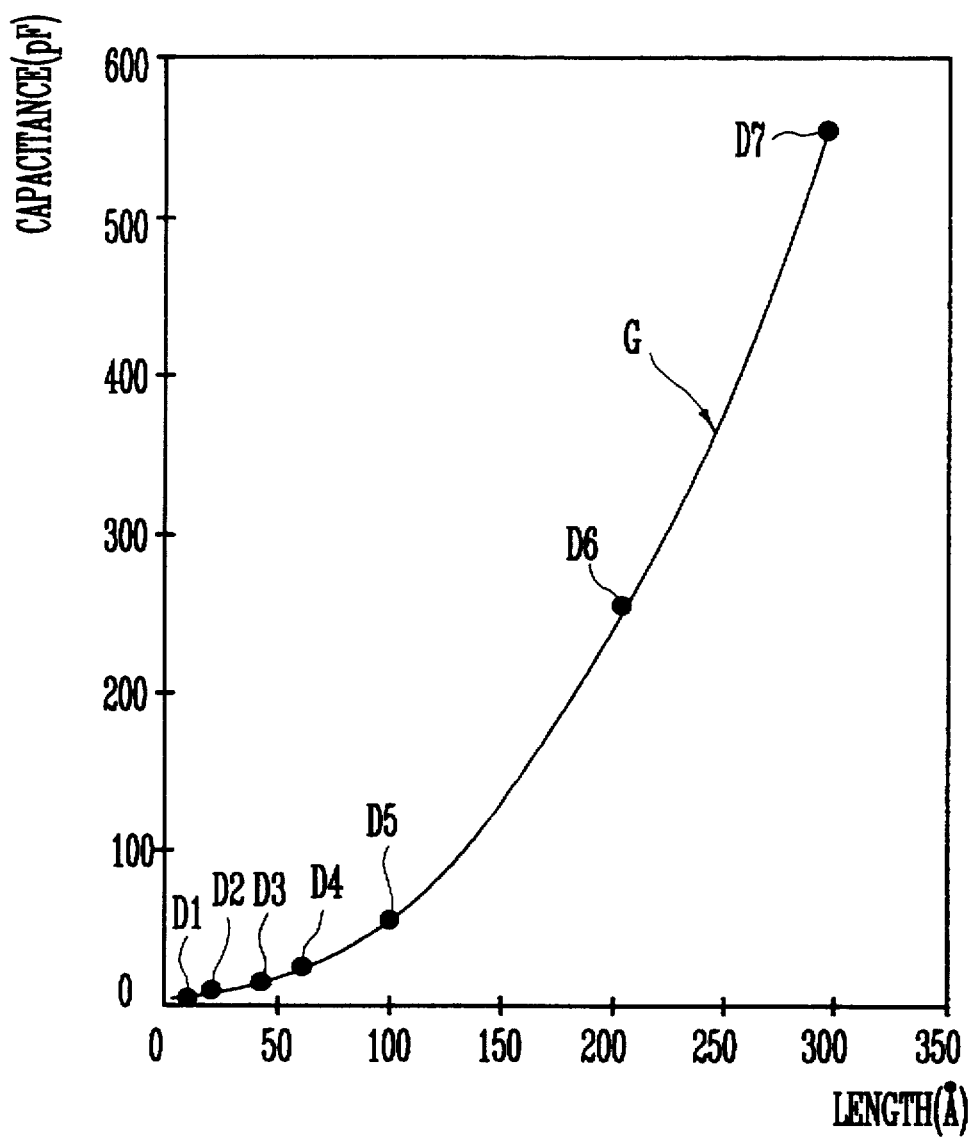
FIG. 3 is a graph showing the capacitance at a plurality of the test patterns of different size as a function of the length.

FIG. 3 shows that the data D1 through D7 of each capacitance and the curve G coincide well to each other as a result of forming a plurality of test patterns of different size, and presenting the data D1 through D7 obtained by expressing each capacitance of each test pattern as a second power function in length, that is the basic equation "C=a+ b·L +c·L$^2$" of the present invention. The curve G is a result of curve fitting by utilizing a second power function, and the curve fitting method is done by utilizing the least square method.

As described above, in the present invention for measuring the capacitance of a test pattern group, a plurality of test patterns of different size are formed, the capacitance of each test pattern is obtained by the basic equation of the present invention "C=a+b·L+c·L$^2$", the bulk overlap capacitance and the capacitance at the pad can be obtained by the constant term and first power term of the basic equation, and the capacitance at the insulation film, the thickness of which is sought after, can be precisely obtained by the second power term.

Therefore, the present invention makes it possible to precisely know the thickness of the insulation film by precisely measuring the capacitance of the insulation film and also makes it possible to precisely measure the bulk overlap capacitance and the capacitance at the pad.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method for electrically measuring a capacitance of an insulation film applied to a semiconductor device and converting the measured capacitance to a thickness of the insulating film, comprising the steps of:

providing a test pattern group having at least 3 (three) test patterns, each of said test patterns having an active region defined in a silicon substrate by forming a field oxide film, an insulation film formed on said active region, a conductive layer formed on said insulation film, and a pad integrated with said conductive layer, wherein each of said active regions of each test pattern having a different size from each other;

measuring the capacitance of each test pattern by making an accumulation mode for each test pattern by applying voltage to each pad and applying ground voltage to said substrate;

deriving each coefficient given to each term of an equation given below by substituting the capacitance value measured on each test pattern and each length of said insulation film comprising each test pattern to said equation according to each test pattern;

$C=a+b\cdot L+c\cdot L^2$ (equation)

(Where, "C" is the capacitance of the test pattern, "a" is the coefficient of the constant term, "b" is the coefficient of the first power term, "c" is the coefficient of the second power term, and "L" is the length of the insulation film)

taking a value of second power term as the capacitance value for each insulation film by applying a second power term coefficient among the derived coefficients to said second power term; and converting the capacitance value at each insulation film to the thickness of each insulation film.

2. The method as claimed in claim 1, wherein each of said active regions is formed of rectangular shape.

3. The method as claimed in claim 1, wherein each of said pads is formed on said field oxide film.

4. The method as claimed in claim 1, wherein each of said pads is identical in their shape and size.

5. The method as claimed in claim 1, wherein said constant term and first power term in said equation become the capacitance value at the portion bulk overlapped at the time of forming said pad and conductive layer.

6. The method as claimed in claim 1, wherein a negative voltage is applied to each pad in the case where said silicon substrate is of P-type.

7. The method as claimed in claim 1, wherein a positive voltage is applied to each pad in the case where said silicon substrate is of N-type.

* * * * *